United States Patent
Moon

(10) Patent No.: US 8,169,843 B2
(45) Date of Patent: May 1, 2012

(54) WAFER TEST TRIGGER SIGNAL GENERATING CIRCUIT OF A SEMICONDUCTOR MEMORY APPARATUS, AND A WAFER TEST CIRCUIT USING THE SAME

(75) Inventor: Hyung-Wook Moon, Ichon (KR)

(73) Assignee: Hynix Semiconductor Inc. (KR)

( * ) Notice: Subject to any disclaimer, the term of this patent is extended or adjusted under 35 U.S.C. 154(b) by 658 days.

(21) Appl. No.: 12/347,213

(22) Filed: Dec. 31, 2008

(65) Prior Publication Data

US 2010/0097872 A1    Apr. 22, 2010

(30) Foreign Application Priority Data

Oct. 21, 2008  (KR) .................. 10-2008-0103289

(51) Int. Cl.
*G11C 7/00* (2006.01)
*G11C 29/00* (2006.01)
(52) U.S. Cl. ............... 365/201; 365/233.5; 365/233.14
(58) Field of Classification Search .............. 365/201, 365/233.5, 233.14
See application file for complete search history.

(56) References Cited

U.S. PATENT DOCUMENTS

| | | | | |
|---|---|---|---|---|
| 5,553,025 | A | * | 9/1996 | Haraguchi ............... 365/201 |
| 5,710,737 | A | | 1/1998 | Komiya et al. |
| 6,058,070 | A | * | 5/2000 | La Rosa ............... 365/233.5 |
| 6,414,890 | B2 | | 7/2002 | Arimoto et al. |
| 6,771,554 | B1 | * | 8/2004 | Lazar ............... 365/222 |
| 7,035,154 | B2 | * | 4/2006 | Takahashi et al. ........ 365/201 |
| 7,184,340 | B2 | * | 2/2007 | Lim ............... 365/201 |
| 7,193,917 | B2 | * | 3/2007 | Takahashi et al. ........ 365/222 |

FOREIGN PATENT DOCUMENTS

| | | |
|---|---|---|
| JP | 11-328997 | 11/1999 |
| KR | 100143361 | 8/1998 |
| KR | 100315347 | 11/2001 |

* cited by examiner

*Primary Examiner* — Tuan T Nguyen
*Assistant Examiner* — Lance Reidlinger
(74) *Attorney, Agent, or Firm* — Baker & McKenzie LLP

(57) ABSTRACT

A wafer test trigger signal generating circuit of a semiconductor memory apparatus includes an enable timing control unit configured to generate an enable signal by using a plurality of address signals, and a trigger signal generating unit configured to generate a test trigger signal, which designates a decoding timing of a test mode defined by the plurality of address signals, in response to the enable signal.

20 Claims, 4 Drawing Sheets

WAFER TEST TRIGGER SIGNAL GENERATING CIRCUIT OF A SEMICONDUCTOR MEMORY APPARATUS, AND A WAFER TEST CIRCUIT USING THE SAME

CROSS-REFERENCES TO RELATED APPLICATION

The present application claims priority under 35 U.S.C. 119(a) to Korean application number 10-2008-0103289, filed on Oct. 21, 2008, in the Korean Intellectual Property Office, which is incorporated herein by reference in its entirety as if set forth in full.

BACKGROUND

1. Technical Field

The embodiments described herein relate to a semiconductor memory apparatus, and more particularly, to a wafer test trigger signal generating circuit, a wafer test circuit using the same, and a semiconductor memory apparatus having the same.

2. Related Art

In general, when a semiconductor memory apparatus is tested in a wafer state, the semiconductor memory apparatus enters various test modes by using a plurality of specific addresses. For example, the semiconductor memory apparatus enters the various test modes by setting one of specific address signals 'add<0:4>' as a trigger signal 'add<4>' and decoding remaining specific address signals 'add<0:3>'. Here, the trigger signal 'add<4>' serves as a factor to determine the decoding timing of the remaining specific address signals 'add<0:3>'. The trigger signal 'add<4>' is controlled by a test apparatus such that the trigger signal 'add<4>' can be enabled at the center of the pulse of the remaining specific addresses 'add<0:3>'.

In order to allow the semiconductor memory apparatus of the wafer state to enter the test modes by using the test apparatus, connection lines are necessary to connect the test apparatus to the semiconductor memory apparatus.

FIG. 1 is a timing diagram showing conventional address skews input into a semiconductor memory apparatus of a wafer state from a test apparatus. In FIG. 1, when the first address signal 'add<0>' is transitioned to a high level, the second to fourth address signals 'add<1>, add<2>', and 'add<3>' must be also transitioned to a high level. However, due to the characteristics of the test apparatus, it is difficult to precisely determine the transition timing of the first to fourth address signals 'add<0>' to 'add<3>' input into the semiconductor memory apparatus.

In addition, the test apparatus must control the transition timing of the first to fourth address signals 'add<0>' to 'add<3>' by taking into consideration characteristics of the lines connected to the semiconductor memory apparatus and the test apparatus, so it is more difficult to precisely determine the transition timing of the first to fourth address signals add '<0>' to 'add<3>'.

In FIG. 1, if a skew (deviation of transition timing) of the second to fourth address signals 'add<1>, 'add<2>', and 'add<3>' occurs on the basis of the first address signal 'add<0>' and a skew of a signal used as a trigger signal 'add<4>' occurs, then the semiconductor memory apparatus may not enter the test mode required by a tester. By way of the example described below and shown in FIG. 1, a presumption is made that the tester introduces the semiconductor memory apparatus into the test mode in which the first to fourth address signals 'add<0>' to 'add<3>' are set to a high level.

In FIG. 1, situation A including the trigger signal 'add<4>' being transitioned in the normal timing even if the skew of the first to fourth address signals 'add<0>' to 'add<3>' occurs. Accordingly, in a state in which the first to fourth address signals 'add<0>' to 'add<3>' are set to a high level, the first to fourth address signals 'add<0>' to 'add<3>' are decoded so that the semiconductor memory apparatus can enter the test mode required by the tester.

In situations B and C, the skew of the first to fourth address signals 'add<0>' to 'add<3>' occurs and the skew of the trigger signal 'add<4>' also occurs. In the situation B, the semiconductor memory apparatus enters the test mode under the condition that the first address signal 'add<0>' is at a high level, the second address signal 'add<1>' is at a high level, the third address signal 'add<2>' is at a low level, and the fourth address signal 'add<3>' is at a high level. In the situation C, the semiconductor memory apparatus enters the test mode under the condition that the first address signal 'add<0>' is at a high level, the second address signal 'add<1>' is at a low level, the third address signal 'add<2>' is at a high level, and the fourth address signal 'add<3>' is at a high level.

Thus, the wafer test circuit of the semiconductor memory apparatus, which is generally used to allow the semiconductor memory apparatus of the wafer state to enter the test mode, cannot enter the test mode required by the tester, so that the test time and the test cost may increase.

Accordingly, one of the specific addresses must be used as the trigger signal and the remaining specific addresses must be decoded in order to allow the semiconductor memory apparatus of the wafer state to enter the test mode. Here, the semiconductor memory apparatus receives the address used as the trigger signal and the addresses to be decoded from the test apparatus through lines. Thus, as shown in FIG. 1, due to the characteristics of the lines that connect the test apparatus to the semiconductor memory apparatus, the semiconductor memory apparatus cannot enter the test mode required by the tester if the skew between the address used as the trigger signal and the addresses to be decoded becomes severe.

SUMMARY

A wafer test trigger signal generating circuit capable of allowing a semiconductor memory apparatus of a wafer state to enter a test mode required by a tester, a wafer test circuit using the same, and a semiconductor memory apparatus having the same are described herein.

In one aspect, a wafer test trigger signal generating circuit of a semiconductor memory apparatus includes an enable timing control unit configured to generate an enable signal by using a plurality of address signals, and a trigger signal generating unit configured to generate a test trigger signal, which designates a decoding timing of a test mode defined by the plurality of address signals, in response to the enable signal.

In another aspect, a wafer test circuit of a semiconductor memory apparatus includes a wafer test trigger signal generating circuit configured to generate a test trigger signal that designates a timing for a plurality of test modes by using a plurality of address signals when a wafer of the semiconductor memory apparatus is tested, and a decoding circuit configured to enable one of the plurality of test modes by decoding the plurality of address signals during an enable period of the test trigger signal.

In another aspect, a wafer test trigger signal generating circuit of a semiconductor memory apparatus includes an enable timing control unit configured to generate an enable signal by using a plurality of address signals, an enable signal generating unit configured to enable a preliminary enable signal at an enabling timing of a first enabled one of a plurality of address signals, a pulse generating unit configured to enable the preliminary enable signal when a time corresponding to about one-half of an enable duration of the first enabled address signal has lapsed after the preliminary enable signal has been enabled, and a trigger signal generating unit configured to generate a test trigger signal in response to the enable signal, wherein the test trigger signal designates a decoding timing of a test mode defined by the plurality of address signals.

In another aspect, a semiconductor memory apparatus includes a wafer test circuit having a wafer test trigger signal generating circuit configured to generate a test trigger signal that designates a timing for a plurality of test modes by using a plurality of address signals when a wafer of the semiconductor memory apparatus is tested, and a decoding circuit configured to enable one of the plurality of test modes by decoding the plurality of address signals during an enable period of the test trigger signal.

These and other features, aspects, and embodiments are described below in the section entitled "Detailed Description."

BRIEF DESCRIPTION OF THE DRAWINGS

Features, aspects, and embodiment are described in conjunction with the attached drawings, in which.

DETAILED DESCRIPTION

Figure 2:
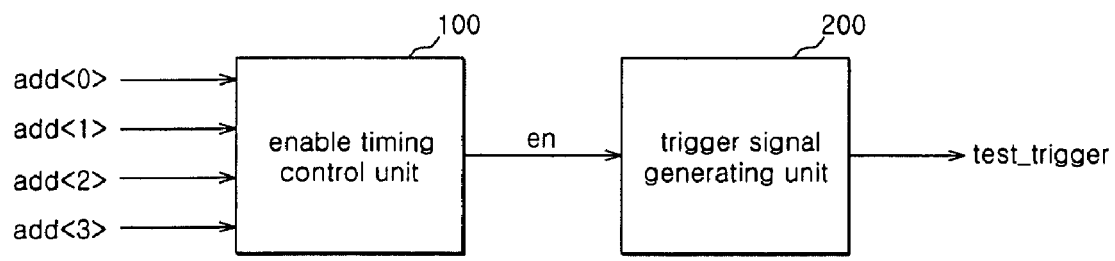
FIG. 2 is a schematic block diagram of an exemplary wafer test trigger signal generating circuit of a semiconductor memory apparatus according to one embodiment.

FIG. 2 is a schematic block diagram of an exemplary wafer test trigger signal generating circuit of a semiconductor memory apparatus according to one embodiment. In FIG. 2, a wafer test trigger signal generating circuit 300 of a semiconductor memory apparatus can be configured to include an enable timing control unit 100, and a trigger signal generating unit 200.

The enable timing control unit 100 can generate an enable signal 'en' when a first predetermined time interval has lapsed from an enable timing of an address, which is firstly enabled among the first to fourth address signals 'add<0>' to 'add<3>'.

The trigger signal generating unit 200 can generate a test trigger signal 'test_trigger' that can be enabled during a second predetermined time interval from an enabling timing of the enable signal 'en'.

Figure 3:
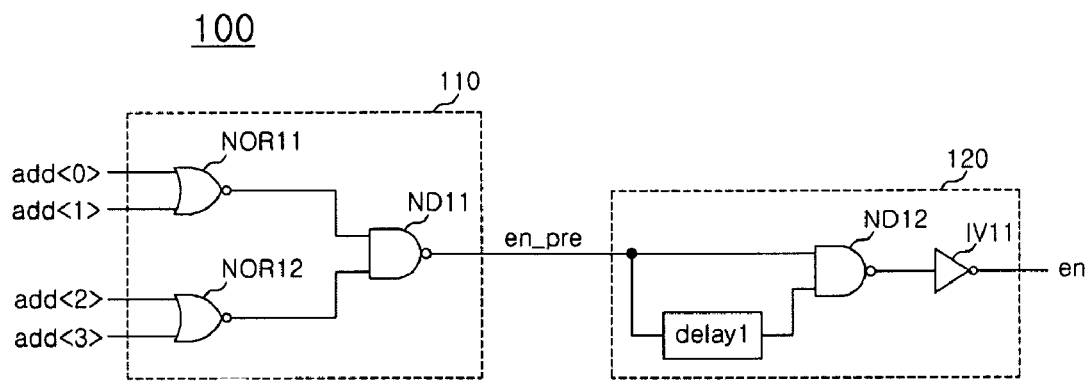
FIG. 3 is a schematic diagram of an exemplary enable timing control unit capable of being implemented in the circuit of FIG. 2 according to one embodiment.

FIG. 3 is a schematic diagram of an exemplary enable timing control unit capable of being implemented in the circuit of FIG. 2 according to one embodiment. In FIG. 3, the enable timing control unit 100 can include an enable signal generating unit 110 and a pulse generating unit 120.

The enable signal generating unit 110 can generate a preliminary enable signal 'en_pre' when any one of the first to fourth address signals 'add<0>' to 'add<3>' is enabled. For example, the enable signal generating unit 110 can be configured to include first and second NOR gates NOR11 and NOR12, and a first NAND gate ND11. The first NOR gate NOR11 can receive the first and second address signals 'add<0>' and 'add<1>', and the second NOR gate NOR12 can receive the third and fourth address signals 'add<2>' and 'add<3>'. In addition, the first NAND gate ND11 can receive output signals of the first and second NOR gates NOR11 and NOR12 to output the preliminary enable signal 'en_pre'. If the preliminary enable signal 'en_pre' is enabled, then the pulse generating unit 120 can enable the enable signal 'en' after the first predetermined time interval has lapsed.

The pulse generating unit 120 can be configured to include a first delay unit delay1, a second NAND gate ND12, and a first inverter IV11. The first delay unit delay1 can delay the preliminary enable signal 'en_pre' for the first predetermine time interval. The second NAND gate ND12 can receive the preliminary enable signal 'en_pre' and an output signal of the first delay unit delay1. The first inverter IV11 can receive an output signal of the second NAND gate ND12 to output the enable signal 'en'.

Figure 4:
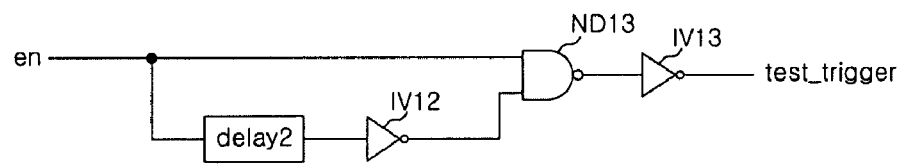
FIG. 4 is a schematic diagram of an exemplary trigger signal generating unit capable of being implemented in the circuit of FIG. 2 according to one embodiment.

FIG. 4 is a schematic diagram of an exemplary trigger signal generating unit capable of being implemented in the circuit of FIG. 2 according to one embodiment. In FIG. 4, the trigger signal generating unit 200 can be configured to include a second delay unit delay2, second and third inverters IV12 and IV13, and a third NAND gate ND13. The second delay unit delay2 can delay the enable signal 'en' for the second predetermined time interval, and the second inverter IV12 can receive an output signal of the second delay unit delay2. The third NAND gate ND13 can receive the enable signal 'en' and an output signal of the second inverter IV12, and the third inverter IV13 can receive an output signal of the third NAND gate ND13 to output the test trigger signal 'test_trigger'.

An exemplary operation of the wafer test trigger signal generating circuit 300 of the semiconductor memory apparatus will be described with reference to FIGS. 3-5.

Figure 5:
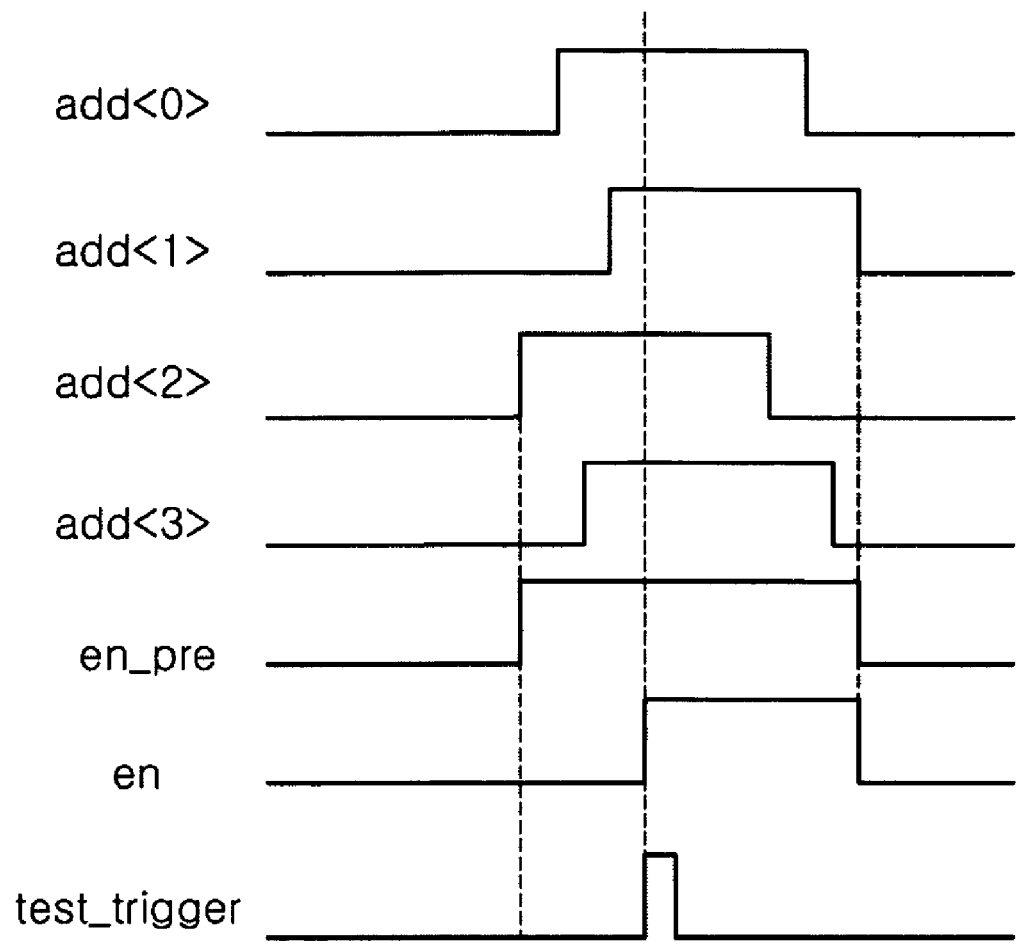
FIG. 5 is a timing diagram of an exemplary wafer test trigger signal generating circuit of a semiconductor memory apparatus according to one embodiment.

FIG. 5 is a timing diagram of an exemplary wafer test trigger signal generating circuit of a semiconductor memory apparatus according to one embodiment. In FIG. 5, the preliminary enable signal 'en_pre' can be enabled into a high level according to the third address signal 'add<2>' that can be firstly enabled among the first to fourth address signals 'add<0>' to 'add<3>'.

If a delay time interval of the first delay unit delay1 (in FIG. 3) has lapsed after the preliminary enable signal 'en_pre' is enabled into a high level, then the enable signal 'en' can be enabled to a high level. If the enable signal 'en' is enabled to a high level, then the test trigger signal 'test_trigger' can be enabled to a high level for the delay time interval of the second delay unit delay1 (in FIG. 4).

Accordingly, the semiconductor memory apparatus of the wafer state is allowed to enter the test mode required by the tester by decoding a plurality of specific addresses. Specifically, the wafer test trigger signal generating circuit 300 of the semiconductor memory apparatus can generate the trigger signal in the semiconductor memory apparatus to reduce the skew between the trigger signal and the addresses to be decoded, thereby allowing the semiconductor memory apparatus to enter the test mode required by the tester.

Since the test apparatus can set the enable period of the specific address input into the semiconductor memory apparatus, the delay time of the first delay unit delay1 (in FIG. 3) can be set to about one-half of enable duration of the specific address.

Figure 1:
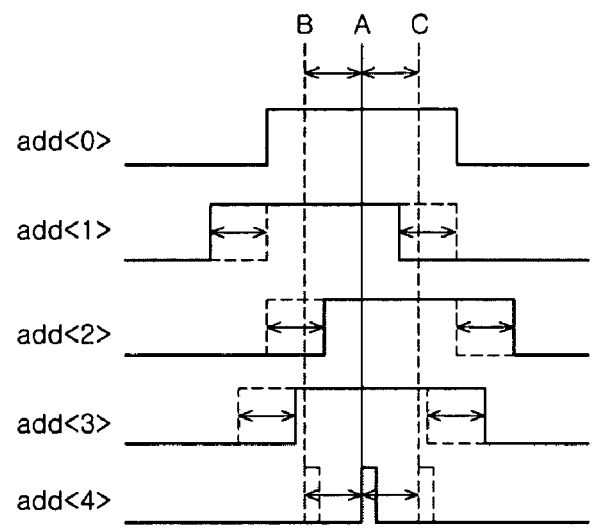
FIG. 1 is a timing diagram showing conventional address skews input into a semiconductor memory apparatus of a wafer state from a test apparatus.

If the delay time of the first delay unit delay1 is set as described above, as shown in situation A of FIG. 1, then the test trigger signal 'test_trigger' can be generated at the center of the enable period of a specific address, which is firstly enabled to a high level, even if the skew is generated in the specific address to be decoded.

Figure 6:
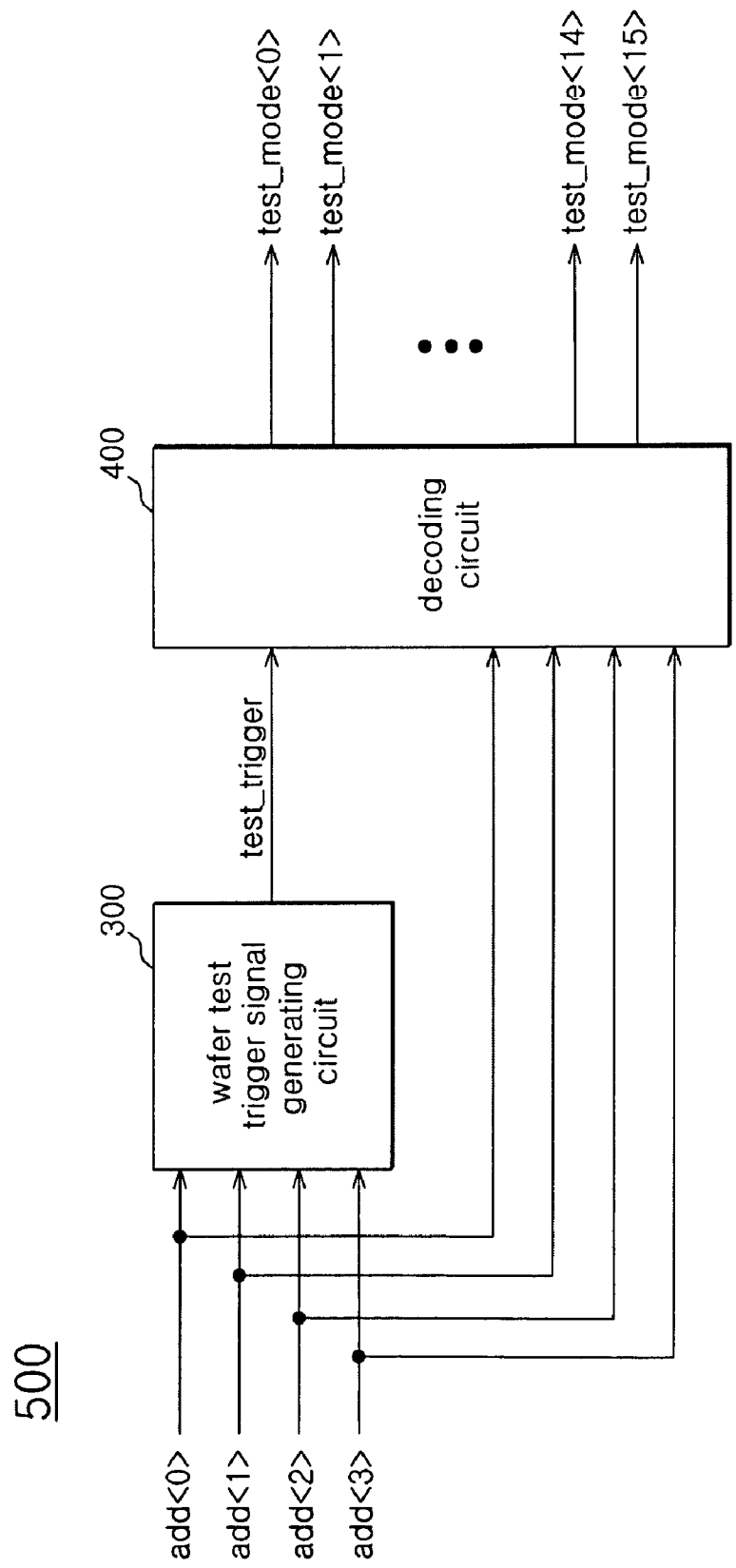
FIG. 6 is a schematic diagram of an exemplary wafer test circuit of a semiconductor memory apparatus having a wafer test trigger signal generating circuit according to one embodiment.

FIG. 6 is a schematic diagram of an exemplary wafer test circuit of a semiconductor memory apparatus having a wafer test trigger signal generating circuit according to one embodiment. In FIG. 6, the wafer test circuit 500 can be configured to include the wafer test trigger signal generating circuit 300 and a decoding circuit 400.

The structure and the operation of the wafer test trigger signal generating circuit 300 can be substantially the same as those of the wafer test trigger signal generating circuit 300 (in FIGS. 2 and 4). Accordingly, detailed description the structure and the operation of the wafer test trigger signal generating circuit 300 (in FIG. 6) will be omitted in order to avoid redundancy.

In FIG. 6, a typical decoding circuit can be used as the decoding circuit 400. Here, the decoding circuit 400 can be configured to decode the first to fourth address signals 'add<0>' to 'add<3>' in the enable period of the output signal of the wafer test trigger signal generating circuit 300, that is, the enable period of the test trigger signal 'test_trigger'. In addition, the decoding circuit 400 can enable one of first to sixteenth test mode signals 'test_mode<0>' to 'test_mode<15>' by decoding the first to fourth address signals 'add<0>' to 'add<3>'. For example, the test trigger signal 'test_trigger' can designate the decoding timing of the test mode defined by the first to fourth address signals 'add<0>' to 'add<3>'.

If one of the first to sixteenth test mode signals 'test_mode<0>' to 'test_mode<15>' is enabled, then the semiconductor memory apparatus of the wafer state can enter the corresponding test mode.

Accordingly, the test trigger signal can be generated from the semiconductor memory apparatus, instead of receiving the test trigger signal from the test apparatus, so the number of lines connected between the test apparatus and the semiconductor memory apparatus can be significantly reduced.

While certain embodiments have been described above, it will be understood that the embodiments described are by way of example only. Accordingly, the systems and methods described herein should not be limited based on the described embodiments. Rather, the systems and methods described herein should only be limited in light of the claims that follow when taken in conjunction with the above description and accompanying drawings.

What is claimed is:

1. A wafer test trigger signal generating circuit of a semiconductor memory apparatus, comprising:
   an enable timing control unit configured to generate an enable signal by using a plurality of address signals; and
   a trigger signal generating unit configured to generate a test trigger signal, which designates a decoding timing of a test mode defined by the plurality of address signals, in response to the enable signal,
   wherein the enable timing control unit generates the enable signal by using an address signal that is firstly enabled among the plurality of address signals.

2. The wafer test trigger signal generating circuit of claim 1, wherein the enable timing control unit enables the enable signal when a predetermined time interval has lapsed from an enabling timing of the address signal that is firstly enabled.

3. The wafer test trigger signal generating circuit of claim 2, wherein the enable timing control unit enables the enable signal when a time corresponding to about one-half of an enable duration of the address signal that is firstly enabled has lapsed from the enabling timing of the address signal.

4. The wafer test trigger signal generating circuit of claim 3, wherein the enable timing control unit includes:
   an enable signal generating unit configured to enable a preliminary enable signal at the enabling timing of the address signal that is firstly enabled; and
   a pulse generating unit configured to enable the enable signal when a time corresponding to about one-half of the enable duration of the address signal that is firstly enabled has lapsed after the preliminary enable signal has been enabled.

5. The wafer test trigger signal generating circuit of claim 1, wherein the test trigger signal generating unit generates the test trigger signal having a predetermined activation period in response to an enablement of the enable signal.

6. A wafer test circuit of a semiconductor memory apparatus, comprising:
   a wafer test trigger signal generating circuit configured to generate a test trigger signal that designates a timing for a plurality of test modes by using a plurality of address signals when a wafer of the semiconductor memory apparatus is tested; and
   a decoding circuit configured to enable one of the plurality of test modes by decoding the plurality of address signals during an enable period of the test trigger signal,
   wherein the wafer test trigger signal generating circuit generates the test trigger signal in response to an enable signal generated by using an address signal that is firstly enabled among the plurality of address signals.

7. The wafer test circuit of claim 6, wherein the wafer test trigger signal generating circuit includes:
   an enable timing control unit configured to generate the enable signal by using the plurality of address signals; and
   a trigger signal generating unit configured to generate the test trigger signal that designates the decoding timing of the test modes defined by the plurality of address signals in response to the enable signal.

8. The wafer test circuit of claim 7, wherein the enable timing control unit generates the enable signal by using the address signal that is firstly enabled among the plurality of address signals.

9. The wafer test circuit of claim 8, wherein the enable timing control unit enables the enable signal when a predetermined time interval has lapsed from an enabling timing of the address signal that is firstly enabled.

10. The wafer test circuit of claim 9, wherein the enable timing control unit enables the enable signal when a time corresponding to about one-half of an enable duration of the address signal that is firstly enabled has lapsed from the enabling timing of the address signal.

11. The wafer test circuit of claim 10, wherein the enable timing control unit includes:
   an enable signal generating unit configured to enable a preliminary enable signal at the enabling timing of the address signal that is firstly enabled; and a pulse generating unit configured to enable the enable signal when a time corresponding to about one-half of the enable duration of the address signal that is firstly enabled has lapsed after the preliminary enable signal has been enabled.

12. The wafer test circuit of claim 7, wherein the test trigger signal generating unit generates the test trigger signal having a predetermined activation period in response to an enable of the enable signal.

13. A wafer test trigger signal generating circuit of a semiconductor memory apparatus, comprising:
   an enable timing control unit configured to generate an enable signal by using a plurality of address signals;
   an enable signal generating unit configured to enable a preliminary enable signal at an enabling timing of a first enabled one of a plurality of address signals;
   a pulse generating unit configured to enable the preliminary enable signal when a time corresponding to about one-half of an enable duration of the first enabled address signal has lapsed after the preliminary enable signal has been enabled; and
   a trigger signal generating unit configured to generate a test trigger signal in response to the enable signal, wherein the test trigger signal designates a decoding timing of a test mode defined by the plurality of address signals.

14. The wafer test trigger signal generating circuit of claim 13, wherein the test trigger signal generating unit generates the test trigger signal having a predetermined activation period in response to an enablement of the preliminary enable signal.

15. A semiconductor memory apparatus, comprising:
   a wafer test circuit including: a wafer test trigger signal generating circuit configured to generate a test trigger signal that designates a timing for a plurality of test modes by using a plurality of address signals when a wafer of the semiconductor memory apparatus is tested; and
   a decoding circuit configured to enable one of the plurality of test modes by decoding the plurality of address signals during an enable period of the test trigger signal,
   wherein the wafer test trigger signal generating circuit generates the test trigger signal in response to an enable signal generated by using an address signal that is firstly enabled among the plurality of address signals.

16. The semiconductor memory apparatus of claim 15, wherein the wafer test trigger signal generating circuit includes:
   an enable timing control unit configured to generate the enable signal by using the plurality of address signals; and
   a trigger signal generating unit configured to generate the test trigger signal that designates the decoding timing of the test modes defined by the plurality of address signals in response to the enable signal.

17. The semiconductor memory apparatus of claim 16, wherein the enable timing control unit generates the enable signal by using the address signal that is firstly enabled among the plurality of address signals.

18. The semiconductor memory apparatus of claim 17, wherein the enable timing control unit enables the enable signal when a predetermined time interval has lapsed from an enabling timing of the address signal that is firstly enabled.

19. The semiconductor memory apparatus of claim 18, wherein the enable timing control unit enables the enable signal when a time corresponding to about one-half of an enable duration of the address signal that is firstly enabled has lapsed from the enabling timing of the address signal.

20. The semiconductor memory apparatus of claim 19, wherein the enable timing control unit includes:
   an enable signal generating unit configured to enable a preliminary enable signal at the enabling timing of the address signal that is firstly enabled; and
   a pulse generating unit configured to enable the enable signal when a time corresponding to about one-half of the enable duration of the address signal that is firstly enabled has lapsed after the preliminary enable signal has been enabled.

* * * * *